US011081177B2

(12) United States Patent
Kumar

(10) Patent No.: US 11,081,177 B2
(45) Date of Patent: Aug. 3, 2021

(54) GENERATING A REFERENCE CURRENT FOR SENSING

(71) Applicant: Arm Limited, Cambridge (GB)

(72) Inventor: Akshay Kumar, New Delhi (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/466,149

(22) PCT Filed: Nov. 10, 2017

(86) PCT No.: PCT/GB2017/053385
§ 371 (c)(1),
(2) Date: Jun. 3, 2019

(87) PCT Pub. No.: WO2018/104699
PCT Pub. Date: Jun. 14, 2018

(65) Prior Publication Data
US 2020/0075095 A1    Mar. 5, 2020

(30) Foreign Application Priority Data
Dec. 5, 2016 (GB) ..................... 1620657

(51) Int. Cl.
*G11C 13/00* (2006.01)
(52) U.S. Cl.
CPC ........ *G11C 13/004* (2013.01); *G11C 13/0002* (2013.01); *G11C 13/0004* (2013.01); *G11C 13/0011* (2013.01); *G11C 2013/0045* (2013.01); *G11C 2013/0054* (2013.01)
(58) Field of Classification Search
CPC ........... G11C 13/0002; G11C 13/0004; G11C 13/0011; G11C 13/004

USPC ......................................... 365/148
See application file for complete search history.

(56) References Cited

U.S. PATENT DOCUMENTS

| 9,806,256 | B1* | 10/2017 | Wu ............. H01L 45/1675 |
| 2004/0105301 | A1* | 6/2004 | Toyoda ............ G11C 14/00 365/154 |
| 2008/0106926 | A1 | 5/2008 | Brubaker et al. |
| 2009/0316471 | A1 | 12/2009 | Tsuchida |
| 2013/0258762 | A1 | 10/2013 | Chih et al. |
| 2014/0078811 | A1 | 3/2014 | Kawai et al. |
| 2014/0321198 | A1* | 10/2014 | Naji ............. G11C 11/1659 365/148 |
| 2015/0255151 | A1 | 9/2015 | Ogiwara et al. |

(Continued)

FOREIGN PATENT DOCUMENTS

WO    2009140299 A2    11/2009
WO    2017025761 A1    2/2017

OTHER PUBLICATIONS

Anderson, W.N., Morley, T.D. & Trapp, G.E. Circuits Systems and Signal Process (1983) 2: 259.

(Continued)

*Primary Examiner* — Anthan Tran

(57) ABSTRACT

Broadly speaking, embodiments of the present techniques provide apparatus and methods for generating a reference current for a memory array sensing scheme, and for using the generated reference current to sense the state of memory cells within the memory array. The generated reference current is particularly suitable for distinguishing between a high resistance state and a low resistance state.

18 Claims, 9 Drawing Sheets

(56) References Cited

U.S. PATENT DOCUMENTS

2016/0133321 A1    5/2016  Nagey
2017/0309324 A1*  10/2017  Kumar ................. G11C 13/003

OTHER PUBLICATIONS

Bae, Woorham, Kyung Jean Yoon, Cheol Seong Hwang and Deog-Kyoon Jeong. "A crossbar resistance switching memory readout scheme with sneak current cancellation based on a two-port current-mode sensing." Nanotechnology 27 48 (2016).
UK Intellectual Property Office, Combined Search and Examination Report, GB1620657.5, dated Mar. 10, 2017.
European Patent Office, International Search Report and Written Opinion, PCT/GB2017/053385, dated Jan. 30, 2018.

* cited by examiner

Voltage Sensing Mode

| No. of Stages in Ladder | Ladder Resistance | Ideal Resistance (Infinite Stages) | Error % |
|---|---|---|---|
| 1 | 5100.00 | 1004.99 | 407% |
| 2 | 2649.02 | 1004.99 | 164% |
| 3 | 1873.79 | 1004.99 | 86% |
| 4 | 1515.15 | 1004.99 | 51% |
| 5 | 1320.79 | 1004.99 | 31% |
| 6 | 1206.40 | 1004.99 | 20% |
| 7 | 1135.77 | 1004.99 | 13% |
| 8 | 1090.87 | 1004.99 | 9% |
| 9 | 1061.80 | 1004.99 | 6% |
| 10 | 1042.74 | 1004.99 | 4% |
| 11 | 1030.16 | 1004.99 | 3% |
| 12 | 1021.80 | 1004.99 | 2% |
| 13 | 1016.23 | 1004.99 | 1% |
| 14 | 1012.52 | 1004.99 | 1% |
| 15 | 1010.03 | 1004.99 | 1% |
| 16 | 1008.37 | 1004.99 | 0% |
| 17 | 1007.25 | 1004.99 | 0% |
| 18 | 1006.51 | 1004.99 | 0% |
| 19 | 1006.01 | 1004.99 | 0% |
| 20 | 1005.67 | 1004.99 | 0% |
| 21 | 1005.45 | 1004.99 | 0% |
| 22 | 1005.30 | 1004.99 | 0% |
| 23 | 1005.19 | 1004.99 | 0% |
| 24 | 1005.13 | 1004.99 | 0% |
| 25 | 1005.08 | 1004.99 | 0% |
| 26 | 1005.05 | 1004.99 | 0% |
| 27 | 1005.03 | 1004.99 | 0% |
| 28 | 1005.02 | 1004.99 | 0% |
| 29 | 1005.01 | 1004.99 | 0% |
| 30 | 1005.00 | 1004.99 | 0% |
| 31 | 1005.00 | 1004.99 | 0% |
| 32 | 1004.99 | 1004.99 | 0% |

FIGURE 7

| Set Value for | | Effective Values post Leakage | | Statistics of Tracking Bitcell Column (at SS, -40) | | |
|---|---|---|---|---|---|---|
| RLRS (Kohms) | RHRS (Mohms) | RLRS (Kohms) | RHRS (Mohms) | Ideal GM (Kohms) | Reff (from circuit, Kohms) | % Error |
| 100 | 10 | 104.8705 | 9.4888 | 997.54 | 1003.7 | 0.62% |
| 50 | 5 | 54.9725 | 4.9356 | 520.89 | 503.1411 | -3.41% |
| 150 | 15 | 154.8313 | 14.0288 | 1473.80 | 1504.3 | 2.07% |
| 50 | 15 | 55.0639 | 18.6922 | 1014.53 | 889.4276 | -12.33% |
| 150 | 5 | 154.843 | 4.8835 | 869.58 | 879.6369 | 1.16% |
| 20 | 2 | 25.2219 | 1.9977 | 224.47 | 202.1311 | -9.95% |
| 200 | 20 | 204.8214 | 18.5375 | 1948.56 | 2018.4 | 3.58% |

FIGURE 9A

| Set Value for | | Effective Values post Leakage | | Statistics of Tracking Bitcell Column (at TT, 25) | | |
|---|---|---|---|---|---|---|
| RLRS (Kohms) | RHRS (Mohms) | RLRS (Kohms) | RHRS (Mohms) | Ideal GM (Kohms) | Reff (from circuit, Kohms) | % Error |
| 100 | 10 | 104.5929 | 8.3837 | 936.42 | 992.4707 | 5.99% |
| 50 | 5 | 54.9785 | 5.4217 | 545.96 | 507.1943 | -7.10% |
| 150 | 15 | 154.7597 | 13.9989 | 1471.89 | 1499.9 | 1.90% |
| 50 | 15 | 54.9052 | 14.5821 | 894.78 | 863.568 | -3.49% |
| 150 | 5 | 154.7704 | 4.8805 | 869.11 | 878.1501 | 1.04% |
| 20 | 2 | 25.114 | 1.9956 | 223.87 | 201.8989 | -9.81% |
| 200 | 20 | 204.7438 | 18.2997 | 1935.65 | 2011.3 | 3.91% |

FIGURE 9B

| Set Value for | | Effective Values post Leakage | | Statistics of Tracking Bitcell Column (at FF, 125) | | |
|---|---|---|---|---|---|---|
| RLRS (Kohms) | RHRS (Mohms) | RLRS (Kohms) | RHRS (Mohms) | Ideal GM (Kohms) | Reff (from circuit, Kohms) | % Error |
| 100 | 10 | 101.0894 | 2.3796 | 490.46 | 514.3226 | 4.87% |
| 50 | 5 | 53.6158 | 1.9174 | 320.63 | 335.4347 | 4.62% |
| 150 | 15 | 147.1506 | 2.5917 | 617.55 | 636.2913 | 3.03% |
| 50 | 15 | 53.6152 | 2.59 | 372.64 | 451.2323 | 21.09% |
| 150 | 5 | 147.1476 | 1.9185 | 531.32 | 514.9796 | -3.08% |
| 20 | 2 | 24.5479 | 1.2184 | 172.94 | 167.5069 | -3.14% |
| 200 | 20 | 191.8086 | 2.7132 | 721.40 | 731.2532 | 1.37% |

FIGURE 9C

GENERATING A REFERENCE CURRENT FOR SENSING

RELATED PATENT APPLICATIONS

This patent application is a 35 U.S.C. 371 National stage U.S. patent application of PCT patent application PCT/GB2017/053385 with an International filing date of Nov. 10, 2017 claiming priority to GB patent application 1620657.5 filed on Dec. 5, 2016, the entire content of which is hereby incorporated by reference.

FIELD OF THE DISCLOSURE

The present techniques generally relate to apparatus and methods for generating a reference current for a memory array sensing scheme.

BACKGROUND

Non-volatile memory devices allow information to be stored and retained after a power source is disconnected. Non-volatile memory devices typically comprise an array of memory cells. Generally speaking, the array comprises multiple columns and rows, and lines running along the rows of the array are called wordlines, while lines running along the columns of the array are called bit lines. Memory cells are located at the intersections of the wordlines and bit lines, which enable the memory cells to be addressed. The logic state of a memory cell may be sensed by applying a voltage to the memory cell, measuring a sense current that flows through the cell, comparing the measured sense current to a reference current, and determining the resistance state of the memory cell based on the comparison. (For example, if the measured sense current is lower than the reference current, the memory cell may be in a high resistance state, or logic state 0, while if the measured sense current is higher than the reference current, the memory cell may be in a low resistance state, or logic state 1). Alternatively, the logic state of a memory cell may be sensed by applying a current to the memory cell. In this case, instead of measuring the sense current through the memory cell, the current is converted into a voltage (by integrating the sense current over a time period), and then measuring the voltage to determine the resistance state of the memory cell.

However, sensing the logic state of a memory cell using a current sensing operation or a voltage sensing operation can be difficult because of the array structure. For example, if the array does not comprise an access transistor for each memory cell, each memory cell remains connected to the wordline and bit line at all times. When the state of a particular memory cell is sensed (using a current sensing operation or a voltage sensing operation), a significant leakage current path exists within the memory array. If the difference between a memory cell in a high resistance state and a memory cell in a low resistance state is small, the leakage path may make it difficult to accurately determine the state of a memory cell.

DESCRIPTION OF THE DRAWINGS

The techniques are diagrammatically illustrated, by way of example, in the accompanying drawings, in which:

FIG. 7 is a table showing how resistance in the tracking circuit of FIG. 5b approaches an ideal resistance value as the number of tracking bit cells in the ladder arrangement increases;

FIG. 9a is a table showing simulation results of a tracking circuit at a slow-slow (SS) process corner at −40° C.;

FIG. 9b is a table showing simulation results of a tracking circuit at a typical-typical (TT) process corner at 25° C.; and FIG. 9c is a table showing simulation results of a tracking circuit at a fast-fast process corner at 125° C.

DETAILED DESCRIPTION

Figure 1:
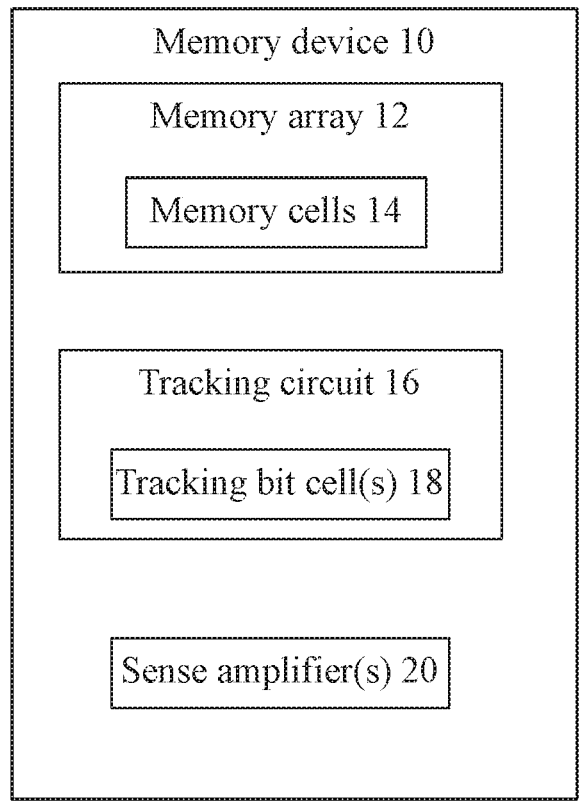
FIG. 1 is a block diagram of a memory device having a tracking circuit to generate a reference current for sensing a state of a memory cell.

Techniques for generating a reference current for a memory array sensing scheme are described herein. The reference current may make it easier to distinguish between a memory cell's high resistance state and low resistance state.

According to a first aspect of the present techniques there is provided a memory device comprising: a memory array comprising a plurality of correlated electron switch (CES) elements; and at least one tracking circuit to generate a reference current for reading each of the plurality of CES elements in the memory array.

According to a second aspect of the present techniques there is provided a memory device comprising: a memory array comprising a plurality of correlated electron switch (CES) elements; at least one tracking circuit to generate a reference current for reading each of the plurality of CES elements in the memory array; and a sensing circuit for reading, using the reference current, one or more of the correlated electron switch elements of the memory array.

According to a third aspect of the present techniques there is provided a method for reading a memory device, the method comprising: applying a read voltage to a tracking circuit, the tracking circuit for generating a reference current for reading a memory array comprising a plurality of correlated electron switch (CES) elements; generating a reference current; and providing the reference current to one or more read circuits for reading the plurality of CES elements of the memory array.

According to a fourth aspect of the present techniques there is provided a method for reading a memory device, the method comprising: precharging a tracking circuit by applying a read voltage to the tracking circuit, the tracking circuit for generating a reference current for reading a memory array comprising a plurality of correlated electron switch (CES) elements; selecting one of the plurality of CES elements to read; precharging a bit line of the selected CES element; discontinuing the read voltage simultaneously from the tracking circuit and the bit line of the selected CES element; monitoring discharging of the tracking circuit and the bit line of the selected CES element; and determining, based on the monitoring, a state of the selected CES element.

Broadly speaking, embodiments of the present techniques provide apparatus and methods for generating a reference current for a memory array sensing scheme, and for using the generated reference current to sense the state of memory cells within the memory array. The generated reference current is particularly suitable for distinguishing between a high resistance state and a low resistance state.

The term "high resistance state" is used interchangeably herein with the term "high impedance state", and the term "low resistance state" is used interchangeably herein with the term "low impedance state".

In typical memory arrays, such as those formed of resistive random access memory (RRAM/ReRAM) memory cells, the state of the memory cells is often determined using a current sensing scheme. The current sensing scheme is used to determine whether a memory cell is in a high resistance state ("HRS", corresponding to logic level '0'), or in a low resistance state ("LRS", corresponding to logic level '1'). However, determining whether a memory cell is in a high resistance state or a low resistance state may be affected by the amount of leakage current. For example, if a memory cell being sensed is in a high resistance state, the worst case scenario occurs when all the unaccessed memory cells (i.e. all the memory cells not being sensed) have the highest leakage current, because this causes a higher than expected read current. This is observed to occur at the fast-fast (FF) process corner of a circuit, at 125° C. (Process corners represent the extremes of the parameter variations within which a circuit that has been etched into a semiconductor wafer must function correctly. A circuit running on devices fabricated at these process corners may run slower or faster than expected, and at lower or higher temperatures and voltages). In another example, if a memory cell being sensed is in a low resistance state, the worst case scenario occurs when all the unaccessed memory cells have the lowest leakage current, because this causes a lower than expected read current. This is observed to occur at the slow-slow (SS) process corner of a circuit, at −40° C.

In an example, the HRS resistance of a memory cell may be 10 MΩ, while the LRS resistance of the memory cell may be 100 kΩ. If a voltage of 0.3V is applied to the bit line when the memory cell is being sensed, then the worst case current when reading the memory cell that is in:

the low resistance state is I=V/R, i.e. 0.3V/100 kΩ=3 µA. This is the lower than expected read current.

the high resistance state is I=V/R+parasitic leakage current, i.e. 0.3V/10 MΩ+170 nA=200 nA. This is the higher than expected read current—the expected read current with no leakage is 30 nA.

(The parasitic leakage current value of 170 nA is determined from a simulation of a column formed of 256 bit cells, each having a high threshold voltage transistor (0.15 µm wide and 0.66 µm long) which leaks).

Therefore, ideally, the reference current for sensing the state of a memory cell may lie substantially in the middle of the higher than expected read current and the lower than expected read current. That is, the reference current ($I_{ref}$) may be given by the geometric mean of the higher than expected read current (which occurs when reading a memory cell that is in the HRS, and therefore is denoted "$I_{HRS}$" herein), and the lower than expected read current (which occurs when reading a memory cell that is in the LRS, and therefore is denoted "$I_{LRS}$" herein), since the margin to both states of the memory cell would be equal:

$$\frac{I_{LRS}}{I_{ref}} = \frac{I_{ref}}{I_{HRS}} \qquad \text{Equation 1}$$

i.e.

$$I_{ref} = \sqrt{I_{HRS} I_{LRS}}$$

For the example above, the reference current $I_{ref}$ would be given by: $\sqrt{3\mu A \times 200 nA} = 775$ nA The present techniques provide a tracking circuit for generating this reference current (which is the geometric mean of the high resistance state current and the low resistance state current), which may be formed from one or more tracking bit cells. The reference current generated using the tracking circuit may be provided to all sense amplifiers used to sense the low power signals from a bit line which represent the data stored in a memory cell. Additionally or alternatively, a tracking circuit may be coupled to each column of the memory array, in order to sense the memory cells coupled to the column—this may provide greater sensing accuracy but also requires more circuitry (which means fewer memory cells per unit area).

Turning to FIG. 1, this shows a block diagram of a memory device 10 comprising a tracking circuit 16 to generate a reference current. The memory device 10 may be any non-volatile memory device which can be electrically erased and reprogrammed, and used to store data. The memory device 10 comprises a memory array 12. The memory array 12 comprises a plurality of memory cells 14. In embodiments, each memory cell 14 of the memory array 12 may be a correlated electron switch (CES) element. A CES element is uniquely differentiated from memristors and ReRAMs due to its 'non-filamentary' nature, which allows the existence of (at least) two distinct and fixed impedance states after fabrication. The impedance of a CES element in a high impedance state (or high resistance state) may be more than 100 times greater than the impedance of the CES element in a low impedance state (or low resistance state). The memory state of the CES element may be detected based, at least in part, on the value of a signal detected on one or more terminals of the CES element in a 'read operation'. The term "correlated electron switch element" is used interchangeably herein with the terms "correlated electron random access memory", "CeRAM", "memory cell", "memory element", "non-volatile memory element", and "non-volatile memory cell". The memory array 12 may be a two-dimensional array comprising wordlines and bit lines, and a memory cell 14 may be located at some or all of the intersections between the wordlines and bit lines.

Accordingly, in embodiments the memory device 10 comprises: a memory array 12 comprising a plurality of correlated electron switch (CES) elements 14; and at least one tracking circuit 16 to generate a reference current for reading each of the plurality of CES elements in the memory array.

The memory device 10 comprises tracking circuit 16 which is arranged to generate a reference current $I_{ref}$ for sensing the state of each memory cell 14. The memory device 10 comprises at least one sense amplifier 20 for sensing the low power signals on a bit line that represent a data bit (i.e. a '1' or '0') stored in a memory cell, and then amplify the voltage to a detectable/recognisable level. The tracking circuit 16 may be used to generate $I_{ref}$, which is then provided to the or each sense amplifier 20 (e.g. by mirroring $I_{ref}$ to each sense amplifier 20). In embodiments, the memory device 10 may comprise more than one tracking circuit 16. For example, the memory device 10 may comprise one tracking circuit 16 coupled to each column (bit line) of the memory array 12. This may provide for greater accuracy memory cell sensing. However, the greater accuracy may, in embodiments, impact memory device density (or chip density) and may reduce the number of memory cells per memory device.

Figure 4:
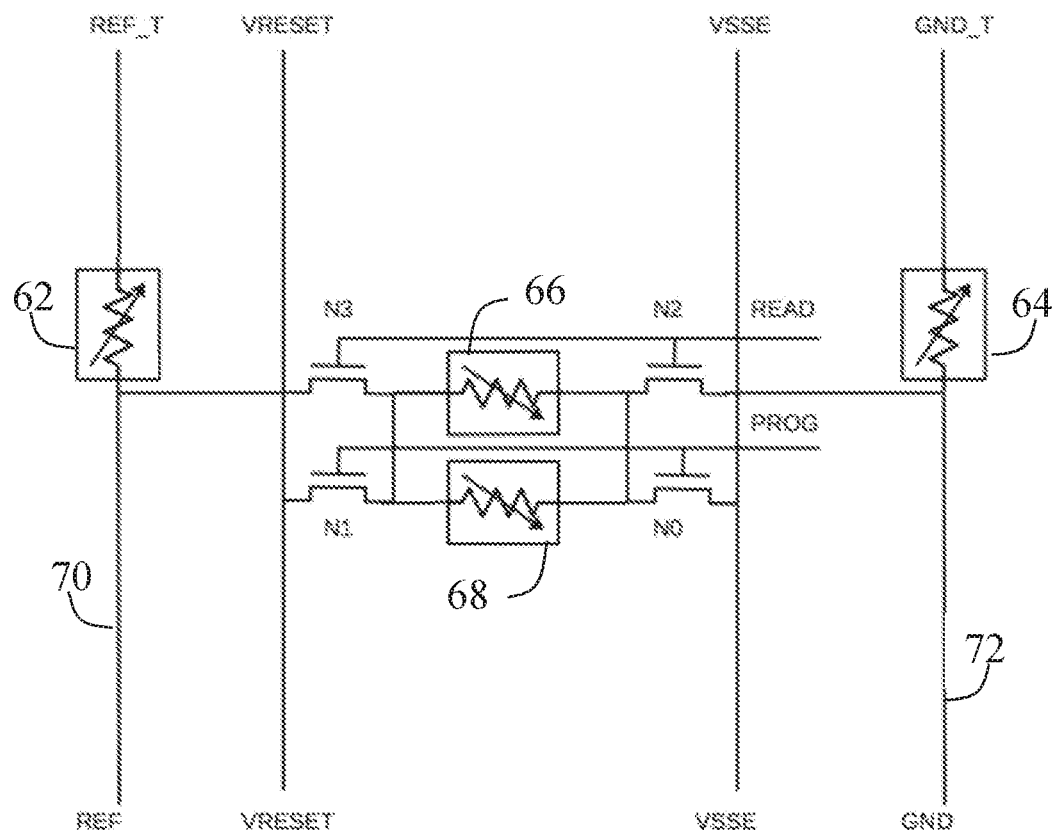
FIG. 4 is a circuit diagram of a tracking bit cell for generating a reference current.
Figure 5B:
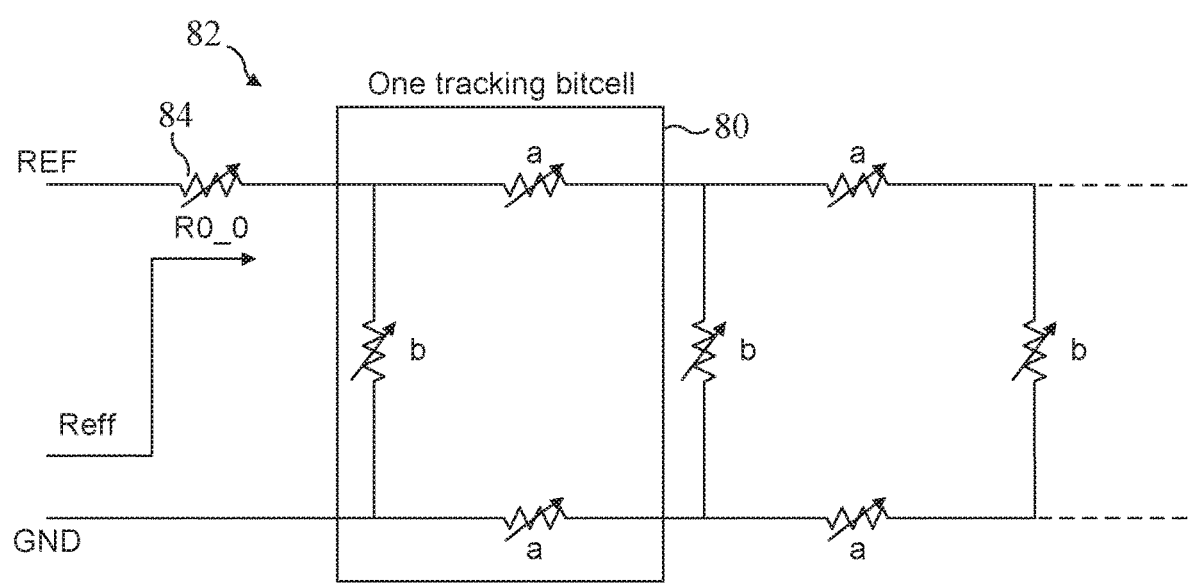
FIG. 5b is a schematic diagram of a tracking circuit formed of a plurality of tracking bit cells that are stacked in a ladder arrangement.
Figure 6:
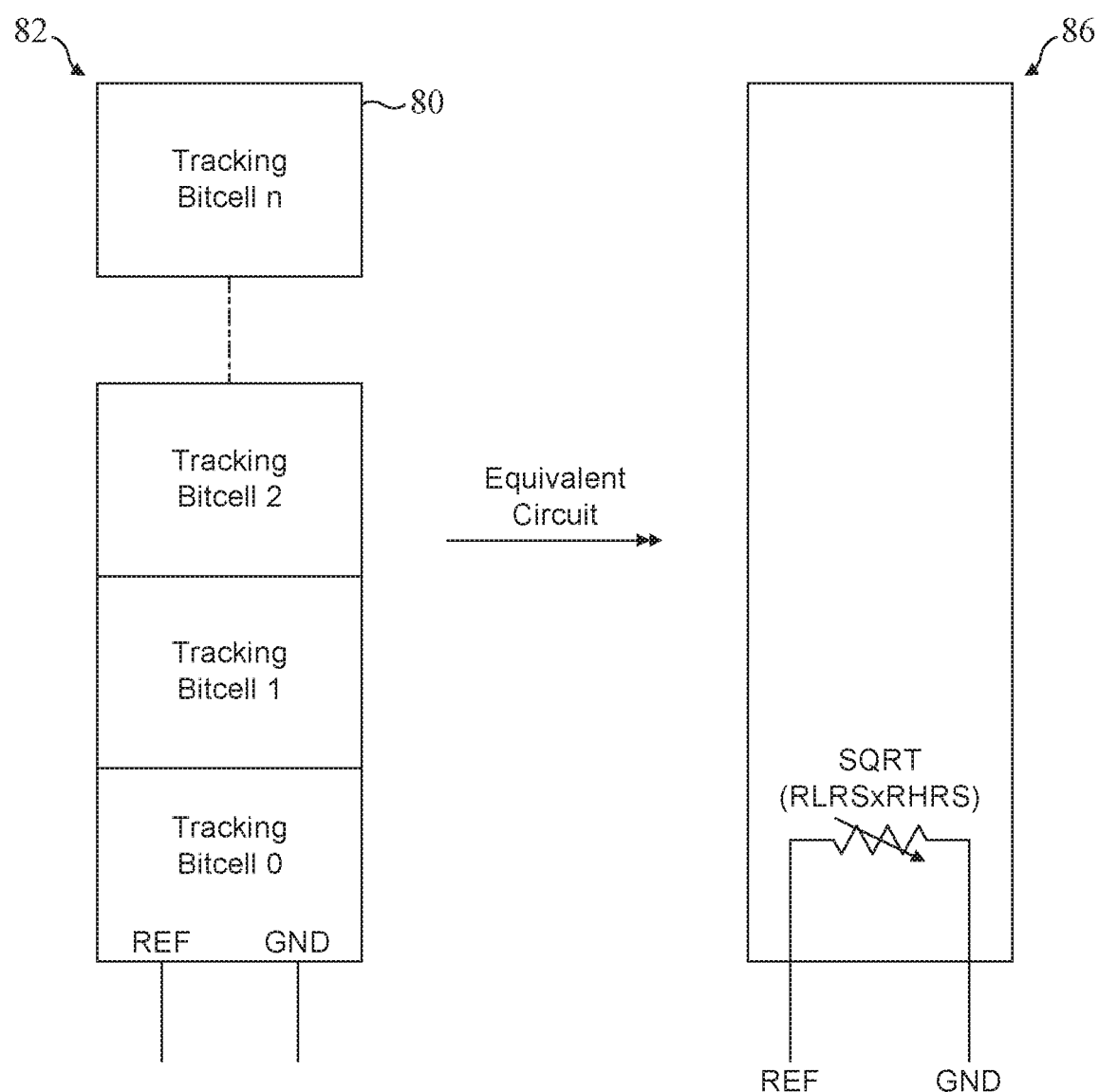
FIG. 6 is a schematic diagram of the tracking circuit of FIG. 5b.

The tracking circuit 16 comprises at least one tracking bit cell 18. An example tracking bit cell 18 is shown in FIG. 4 and described below. In embodiments, the tracking circuit 16 is formed of a plurality of tracking bit cells 18, which may be stacked in a ladder arrangement as shown in FIGS. 5b and 6 and described below. Each tracking bit cell 18 is formed of a plurality of resistive elements of the same type as in the memory array 12. That is, each tracking bit cell 18 comprises a plurality of memory cells 14, of the same type as in memory array 12. This is because the tracking bit cell 18 is used to generate a reference current by applying a read voltage to a circuit containing resistive elements (i.e. memory cells) such that the outputted current is approximately equal to a reference current (as given by Equation 1 above) for reading the memory cells 14 of memory array 12. That is, the reference current is generated using the same read voltage that will be used to read a memory cell 14, and using the same resistance values that will be present in the memory array 12. Thus, in embodiments, and as explained in more detail below, the tracking bit cell 18 may comprise a plurality of CES elements, some of which are in the low resistance state, and some of which are in the high resistance state. Increasing the number of tracking bit cells 18 that are stacked in the ladder arrangement may mean the outputted current approaches the reference current $I_{ref}$. However, in practice, stacking more than sixteen tracking bit cells 18 in the ladder arrangement may not result in significant improvements in the accuracy of the reference current. This is because the incremental improvement in accuracy resulting from adding a tracking bit cell to the stack may decrease/be relatively small after more than sixteen tracking bit cells have been stacked.

Figure 2:
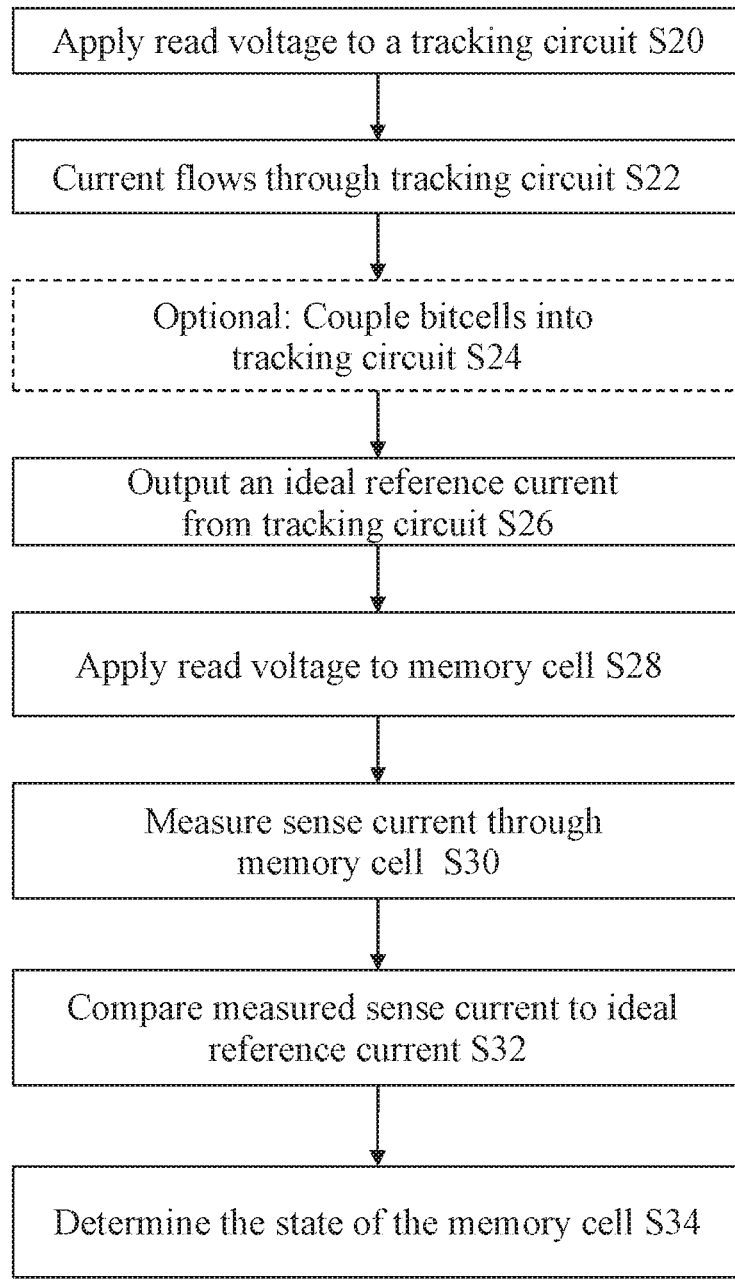
FIG. 2 is a flow diagram of example steps to generate a reference current and use the generated current for a current sensing operation mode.

FIG. 2 is a flow diagram of example steps to generate a reference current and use the generated current for a current sensing operation mode. Generally speaking, in current sensing mode a voltage is applied to a memory cell 14, and a sense current that flows through the memory cell is measured. A sense amplifier or sensing circuit compares the measured sense current to a reference current, and determines the state of the memory cell based on the comparison. (For example, if the measured sense current is lower than the reference current, the memory cell may be in a high resistance state, or logic state 0, while if the measured sense current is higher than the reference current, the memory cell may be in a low resistance state, or logic state 1).

In embodiments of the present techniques, the process of generating a reference current and using it in a current sensing operation begins by applying a read voltage to a tracking circuit (FIG. 2, step S20). The read voltage applied to the tracking circuit is the same read voltage that will be applied to a memory cell during the read/sense operation, so that the reference current is generated based on the same input (i.e. the read voltage). The tracking circuit itself is formed of the same types of resistive elements as the memory array, for the same reason. Applying the read voltage to the tracking circuit causes a current to flow through the tracking circuit (step S22), i.e. through the resistive elements of the tracking circuit which have the same resistance values as the memory cells 14 of the memory array 12. As discussed above, a leakage current is often observed when reading a memory cell, particularly if the memory cell being read is in a high resistance state. (This leakage current may be due to the unaccessed memory cells on the same bit line in the memory array 12. If the bit line is very short (say 32 rows per bit line), this leakage current may be negligibly small. However, in most memory arrays, tall/long bit lines are used to increase the memory array density, and therefore, the leakage current may not be negligible.) Thus, the reference current generated by the tracking circuit 16 may take into account the leakage current observed when reading a memory cell. Thus, optionally, the leakage current may be accounted for by incorporating one or more bit cells into the tracking circuit 16 (step S24)—this is explained in more detail below with reference to FIG. 8. (It will be understood that the bitcell(s) may be temporarily coupled into the tracking circuit 16, or permanently coupled into the tracking circuit 16 at the point of manufacture of the memory device 10. It will also be understood that this coupling may occur before the read voltage is applied to a tracking circuit at step S20, particularly if the coupling is permanent). A reference current $I_{ref}$, or an approximation thereof, is outputted from the tracking circuit (step S26).

The outputted reference current $I_{ref}$ may be used to sense the state of (i.e. read) a memory cell 14. The read voltage is applied to a memory cell 14 which is to be read (step S28). The sense current flowing through the memory cell 14 is measured (step S30). The measured sense current is compared to the reference current $I_{ref}$ (step S32), and the state of the memory cell is determined based on whether the measured sense current is higher or lower than the reference current (step S34). For example, if the measured sense current is less than the reference current $I_{ref}$, the memory cell may be in a high resistance state, or logic state 0, while if the measured sense current is greater than the reference current, the memory cell may be in a low resistance state, or logic state 1.)

Accordingly, in embodiments the method for reading a memory device 10 comprises: applying a read voltage to a tracking circuit 16, the tracking circuit for generating a reference current for reading a memory array 12 comprising a plurality of correlated electron switch (CES) elements 14; outputting a reference current; and providing the reference current to one or more read circuits (or sense amplifiers, or sensing circuits) for reading the plurality of CES elements of the memory array.

The method may further comprise: selecting one of the plurality of CES elements to read; applying the read voltage to the selected CES element; measuring a sense current through the selected CES element; comparing the measured sense current to the generated reference current; and determining, based on the comparing, a state of the selected CES element.

Figure 3:
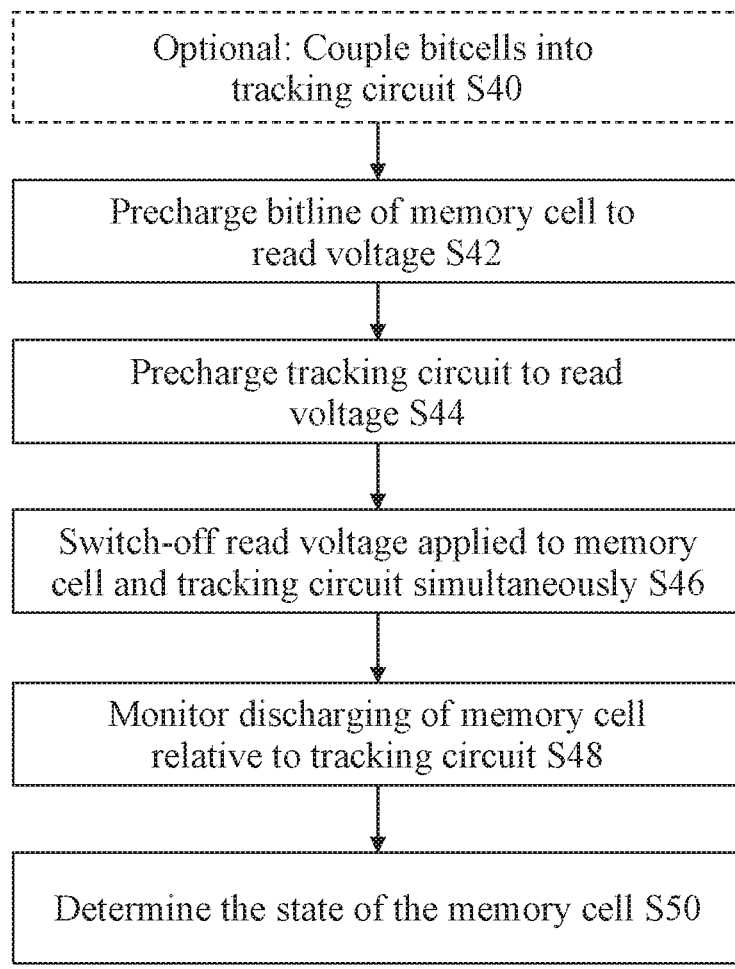
FIG. 3 is a flow diagram of example steps to generate a reference current and use the generated current for a voltage sensing operation mode.

FIG. 3 is a flow diagram of example steps to generate a reference current and use the generated current for a voltage sensing operation mode. In this embodiment, the scheme used to read the memory cells 14 of the memory array 12 is a voltage-based sensing scheme. Generally speaking, in voltage sensing mode the bit line of a memory cell 14 to be read is precharged, by applying a voltage (e.g. a read voltage) to the bit line. The tracking circuit 16 is also precharged with the same read voltage. At some time, the precharging is terminated/discontinued, and the change (decrease) in the voltage across the memory cell 14 and the tracking circuit 16 is monitored. In other words, the discharging of the memory cell 14 and the tracking circuit 16 is monitored. If the memory cell being sensed is in a low resistance state, the voltage falls rapidly (i.e. the bit line discharges quickly), while if the memory cell being sensed is in a high resistance state, the voltage falls slowly (i.e. the bit line discharges slowly). The rate at which the bit line of the memory cell 14 discharges is compared with the rate at which the tracking circuit 16 discharges, in order to determine if the memory cell 14 is in a high resistance state or a low resistance state. The tracking circuit 16 discharges at a rate between the rate of a low resistance state memory cell, and the rate of a high resistance state memory cell, because the discharging current for the tracking circuit 16 is in between $I_{HRS}$ and $I_{LRS}$. That is, the current flowing through the tracking circuit 16 when the read voltage is discontinued/removed, is the reference current $I_{ref}$. Thus, comparing the rate at which the memory cell 14 discharges with the rate at which the tracking circuit 16 discharges (i.e. the reference discharging rate) enables the state of the memory cell 14 to be determined. Specifically, if when the tracking circuit 16 has discharged completely the memory cell 14 is still discharging, the memory cell 14 is determined to be in a high resistance state (because it is discharging slower than the reference, i.e. the tracking circuit 16). Similarly, if when the tracking circuit 16 has discharged completely the memory cell 14 has also discharged completely, the memory cell 14 is determined to be in a low resistance state (because it has discharged faster than the reference, i.e. the tracking circuit 16).

In embodiments of the present techniques, the process of generating a reference current and using it in a voltage sensing operation begins by precharging a reference column line of a memory cell 14 to be sensed with a particular voltage (FIG. 3, step S42), and precharging the tracking circuit 16 (step S44). The voltage applied to the tracking circuit 16 during this precharging phase is the same (read) voltage that is applied to the memory cell 14 during the precharging phase, so that the same precharge is applied to both the tracking circuit 16 and the memory cell 14, to enable comparison of their discharge rates.

As discussed earlier, a leakage current is often observed when reading a memory cell, particularly if the memory cell being read is in a high resistance state. (This leakage current may be due to the unaccessed memory cells on the same bit line in the memory array 12. If the bit line is very short (say 32 rows per bit line), this leakage current may be negligibly small. However, in most memory arrays, tall/long bit lines are used to increase the memory array density, and therefore, the leakage current may not be negligible.) Thus, the reference current generated by the tracking circuit 16 may take into account the leakage current observed when reading a memory cell. Thus, optionally, the leakage current may be accounted for by incorporating one or more bit cells into the tracking circuit 16 (step S40)—this is explained in more detail below with reference to FIG. 8. (It will be understood that the bitcell(s) may be temporarily coupled into the tracking circuit 16, or permanently coupled into the tracking circuit 16 at the point of manufacture of the memory device 10).

After the precharging phase is complete, the voltage applied to the bit line of the memory cell 14 being sensed and the tracking circuit 16 is substantially simultaneously removed (step S46). It is important for the precharging of both the memory cell 14 and the tracking circuit 16 to be simultaneously discontinued because the voltage sensing operation measures/monitors how quickly the memory cell discharges relative to the tracking circuit and uses this to determine the state of the memory cell. Removing the read voltage causes a current to flow through the bit line of the memory cell 14 and through the tracking circuit 16, which can be measured either directly or by tracking the change (decrease) in voltage across the memory cell 14 and the tracking circuit 16 (which is indicative of the current). Thus, at step S48, the discharging of (or voltage change across) the memory cell 14 and tracking circuit 16 is monitored. Comparing the rate of discharge of the memory cell 14 and the tracking circuit 16 enables determination of the state of the memory cell 14 (step S50). Specifically, if when the tracking circuit 16 has discharged completely the memory cell 14 is still discharging, the memory cell 14 is determined to be in a high resistance state (because it is discharging slower than the reference, i.e. the tracking circuit 16). Similarly, if when the tracking circuit 16 has discharged completely the memory cell 14 has also discharged completely, the memory cell 14 is determined to be in a low resistance state (because it has discharged faster than the reference, i.e. the tracking circuit 16).

In embodiments, there is provided a method for reading a memory device, the method comprising: precharging a tracking circuit by applying a read voltage to the tracking circuit, the tracking circuit for generating a reference current for reading a memory array comprising a plurality of correlated electron switch (CES) elements; selecting one of the plurality of CES elements to read; precharging a bit line of the selected CES element; discontinuing the read voltage simultaneously from the tracking circuit and the bit line of the selected CES element; monitoring discharging of the tracking circuit and the bit line of the selected CES element; and determining, based on the monitoring, a state of the selected CES element.

The step of determining a state of the selected CES element may comprise determining if, when the tracking circuit has discharged, the bit line of the selected CES element has discharged. In embodiments, if the bit line of the selected CES element has discharged, the state of the selected CES element is determined to be a low impedance state. Similarly, if the bit line of the selected CES element has not discharged when the tracking circuit has discharged, the state of the selected CES element is determined to be a high impedance state.

Thus, the tracking circuit described herein may be used to generate a reference current that can be used to determine the state of a memory cell in both current sensing mode and voltage sensing mode. Embodiments of the tracking circuit itself are now described.

FIG. 4 is a circuit diagram of an example tracking bit cell 60 for generating (or approximating) a reference current. The tracking bit cell 60 is a basic unit of the tracking circuit 16 shown in FIG. 1. The tracking circuit 16 may be comprised of a single tracking bit cell 60, or may be formed of a plurality of tracking bit cells 60. The plurality of tracking bit cells 60 may be stacked in a ladder arrangement, and the more tracking bit cells 60 present in the tracking circuit 16, the better the approximation of the reference current. The tracking bit cell 60 comprises a reference column line 70 and a first memory cell 62 coupled in series to the reference column line. The tracking bit cell 60 comprises a ground column line 72, and a second memory cell 64 coupled in series to the ground column line. The tracking bit cell 60 comprises a third memory cell 66 and a fourth memory cell 68 which are in a parallel arrangement between the reference column line 70 and the ground column line 72. The first memory cell 62, the second memory cell 64, the third memory cell 66 and the fourth memory cell 68 are all of the same type of memory cell as used in the memory array 12 of the memory device 10. In embodiments, the memory cells 62 to 68 are correlated electron switch (CES) elements.

Thus, in embodiments, the tracking circuit comprises at least one tracking bit cell, and wherein the tracking bit cell comprises: a reference column line, and a first CES element provided in series with the reference column line; a ground column line, and a second CES element provided in series with the ground column line; and a third CES element and a fourth CES element provided in a parallel arrangement between the reference column line and the ground column line.

The tracking bit cell 60 comprises transistors N0, N1, N2 and N4 which may be used to program the CES elements 66 and 68 into a high resistance state. As explained above, the reference current may be determined by calculating the geometric mean of $I_{HRS}$ and $I_{LRS}$ (see Equation 1). The tracking bit cell 60 is therefore formed of CES elements which are in a high resistance state and CES elements which are in a low resistance state, such that the output of the tracking bit cell 60 is an approximation of the geometric mean of $I_{HRS}$ and $I_{LRS}$. (The more tracking bit cells 60 are stacked to form tracking circuit 16, the closer the approximation to the geometric mean and to the reference current $I_{ref}$). CES elements, generally speaking, are "born on", such that when a CES element is fabricated, the CES element is in a low impedance/resistance state. Accordingly, in embodiments, transistors N0 and N1 are programmed into a high resistance/impedance state once at the point at which the memory device 10 (or at least tracking circuit 16) is manufactured (e.g. as part of an initialisation procedure). The programming may be performed by asserting a PROG signal (low). In alternative embodiments, transistors N0 and N1 are programmed into a high resistance/impedance state every time the memory device 10 is powered-up (e.g. once every power-up cycle). Once the CES elements 66 and 68 have been programmed into the high resistance state, transistors N0 and N1 are turned-off (e.g. by de-asserting a PROG signal (high)). Thus, after programming has been completed, CES elements 62 and 64 are in a low resistance state, and CES elements 66 and 68 are in a high resistance state.

In embodiments, the first CES element, the second CES element, the third CES element and the fourth CES element are manufactured in a low impedance state, i.e. 'born on'. In embodiments, the third CES element and the fourth CES element of the or each tracking bit cell are both programmed into a high impedance state. In embodiments, the third CES element and the fourth CES element of the or each tracking bit cell are programmed into a high impedance state once during an initialisation process. Additionally or alternatively, the third CES element and the fourth CES element of the or each tracking bit cell are programmed into a high impedance state each time the tracking circuit is used to generate the reference current.

Figure 5A:
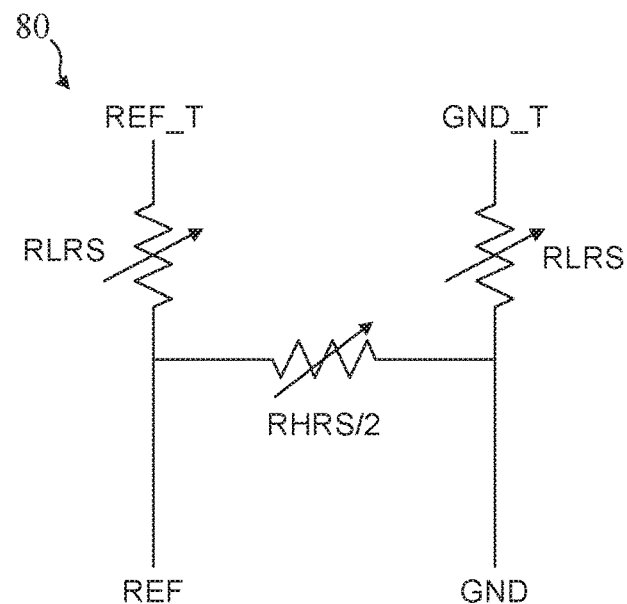
FIG. 5a is the equivalent circuit representation of the tracking bit cell of FIG. 4.

FIG. 5a is an equivalent circuit representation of the tracking bit cell 60 of FIG. 4 when a READ signal is asserted (high). Asserting the READ signal causes transistors N2 and N3 to turn on, which causes the tracking bit cell circuit to be reduced to the equivalent circuit 80 shown in FIG. 5a. (It will be understood that the equivalent circuit representation assumes that the ON-state resistance of transistors N2 and N3 is negligible relative to the CES elements 66 and 68 which are in a high resistance state).

As mentioned above, stacking a plurality of tracking bit cells 60 in a ladder arrangement enables a closer approximation to the reference current to be generated. FIG. 5b is a schematic diagram of a tracking circuit 82 formed of a plurality of tracking bit cells 80 that are stacked in a ladder arrangement. The tracking circuit 82 comprises multiple tracking bit cells 80 that have been stacked on top of each other to implement a tracking column or ladder. Each resistor labelled 'a' represents a CES elements in a low resistance state, while each resistor labelled 'b' represents two CES elements in a high resistance state and arranged in parallel. The tracking circuit 82 comprises a further CES element 84 (labelled as R0_0 in FIG. 5b), which is in series with the reference column line.

The resistance of tracking circuit 82, assuming an infinite ladder length, is given by:

$$R_{eff} = a\sqrt{1 + \frac{2b}{a}}$$ Equation 2 where $a = R_{LRS}$ and $$b = \frac{R_{HRS}}{2}.$$

Thus, the effective resistance of a tracking circuit 82 formed of an infinite number of tracking bit cells 80 is given by:

$$R_{eff} = R_{LRS}\sqrt{1 + \frac{R_{HRS}}{R_{LRS}}}$$ Equation 3

$$R_{eff} \approx \sqrt{R_{LRS} R_{HRS}}$$

FIG. 6 is a schematic diagram of the tracking circuit of FIG. 5b. The tracking circuit 82 may be approximated by the equivalent circuit 86, based on Equation 3 above.

In embodiments, the tracking circuit comprises a plurality of tracking bit cells that are stacked in a ladder arrangement. For example, the tracking circuit may comprise 16 or 32 tracking bit cells that are stacked in a ladder arrangement.

FIG. 7 is a table showing how resistance in the tracking circuit 86 of FIG. 5b approaches a resistance value (and therefore, a reference current) as the number of tracking bit cells in the ladder arrangement increases. The data in the table of FIG. 7 was obtained from a simulation. A tracking circuit formed of an infinite number of tracking bit cells is impossible to construct, but a good approximation of the resistance value (and reference current) can be obtained by stacking a finite number of tracking bit cells. The data in the table is based on incrementally stacking tracking bit cells of the type shown in FIG. 4 into a ladder arrangement of the type shown in FIG. 5b. That is, the ladder arrangement is built in stages, starting with a single tracking bit cell and adding a tracking bit cell until a ladder containing 32 tracking bit cells has been formed. At each stage, a voltage of 0.3V is applied to the reference line of the ladder, and the current through the reference node is measured. The ladder resistance at each stage is determined using Ohm's law.

As shown in the table, the resistance of a tracking circuit formed of a single tracking bit cell is not a good approximation to the resistance, and therefore, does not generate a good approximation of the reference current. However, by the time sixteen tracking bit cells have been stacked in a ladder arrangement, the resistance through the tracking circuit is close to the resistance value, and a tracking circuit formed of 32 tracking bit cells results in the resistance being a good approximation to the resistance value. Therefore, sixteen tracking bit cells provided in a ladder arrangement may provide a reasonable approximation to the reference current, while 32 tracking bit cells provided in a ladder arrangement may provide a good approximation to the reference current.

In each of FIGS. 4, 5a, 5b, and 6, applying a read voltage (i.e. the voltage used to read a memory cell 14) to the reference column line (or the REF node) causes a reference current to be generated by the tracking circuit/tracking bit cell.

In embodiments, the reference current generated by the tracking circuit is a geometric mean of a current through a CES element in a high impedance state and a current through a CES element in a low impedance state.

In embodiments, the tracking circuit may comprise a reference node and wherein application of a read voltage to the reference node generates the reference current.

In embodiments, the memory device 10 further comprises a sensing means, e.g. a sensing circuit or a plurality of sense amplifiers coupled to the plurality of CES elements of the memory array. The reference current generated by the tracking circuit may be mirrored to each of the plurality of sense amplifiers/sensing means. Additionally or alternatively, the memory device 10 comprises a plurality of sense amplifiers, wherein one of the plurality of sense amplifiers is coupled to each column of the memory array; and wherein the reference current generated by the tracking circuit is mirrored to each of the plurality of sense amplifiers. Additionally or alternatively, the memory device comprises a plurality of sense amplifiers, wherein one of the plurality of sense amplifiers is coupled to each column of the memory array; a plurality of tracking circuits, wherein one tracking circuit is coupled to the sense amplifier coupled to each column of the memory array; and wherein each tracking circuit generates the reference current for the sense amplifier to which the tracking circuit is coupled.

As mentioned above, if a memory cell being sensed is in a high resistance state, the highest leakage current is observed. As explained earlier, the leakage current may be due to the unaccessed memory cells on the same bit line in the memory array 12 as the memory cell being sensed. More specifically, the leakage current may be due to the turned-off transistor in each of the unaccessed memory cells on the same bit line as the memory cell being sensed/read. Furthermore, when the memory cell being sensed is in a high resistance state, the leakage current may form the largest component of the observed current. For example, if the current was expected to be 30 nA but the observed current is 200 nA, this is because of 170 nA of leakage current. In this case, the leakage current forms the majority/is the largest component of the observed current. Accordingly, while the tracking circuit shown in FIGS. 5b and 6 may be able to generate a good approximation/estimate of the effective resistance (as shown in Equation 3), the tracking circuit will not be able to provide a good approximation of the reference current because the tracking circuit does not account for the leakage current. Thus, embodiments of the present techniques provide a tracking circuit which accounts for leakage current, and which thereby provides a better approximation of the reference current for a leaky circuit.

Figure 8:
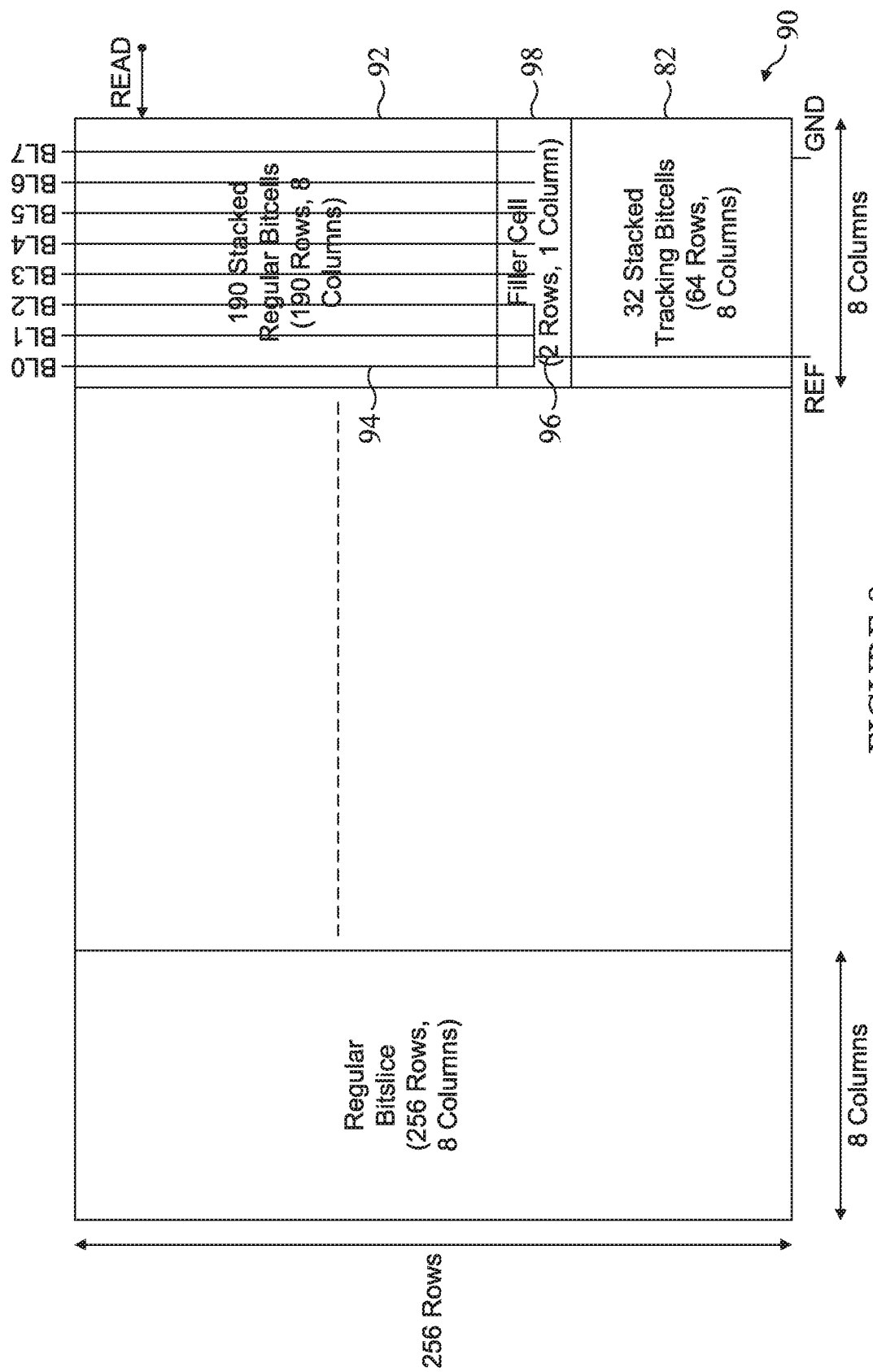
FIG. 8 is a schematic diagram of a tracking circuit comprising a plurality of tracking bit cells stacked in a ladder arrangement and a plurality of bit cells to provide a leakage current offset.

FIG. 8 is a schematic diagram of a tracking circuit 90 comprising a plurality of tracking bit cells 82 stacked in a ladder arrangement and a plurality of bit cells 92 to provide a leakage current offset. Assuming that the low resistance state current is $I_{LRS}$, that the high resistance state current is $I_{HRS}$ (i.e. no leakage current present), that $$I_{HRS} = \frac{I_{LRS}}{100},$$

and that the leakage current $I_{leak}$ in the high resistance state (caused by the unaccessed memory cells remaining connected to the wordlines and bit lines when another memory cell is being sensed), then the reference current is provided by:

$$I_{ref} = \sqrt{(I_{HRS} + I_{leak})I_{LRS}} \qquad \text{Equation 4}$$

As explained above, the tracking circuit formed of stacked tracking bit cells is able to generate a current that provides a good approximation to the geometric mean (shown in Equation 1), and therefore may be modified to account for the leakage current. This leakage current may be accounted for by modifying the tracking circuit to generate an additional current x. To obtain the reference current/geometric mean, the following condition must be satisfied:

$$\sqrt{I_{HRS}I_{LRS}} + x = \sqrt{(I_{HRS} + I_{leak})I_{LRS}}$$

$$\therefore = \sqrt{(I_{HRS} + I_{leak})I_{LRS}} - \sqrt{I_{HRS}I_{LRS}} \qquad \text{Equation 5}$$

In an example, $I_{LRS}$=3 µA, $I_{HRS}$=300 nA and $I_{leak}$=170 nA, such that the additional current x=475 nA. (These values are based on simulations of a fast-fast process corner at 125° C.). This additional current x is roughly three times the leakage current obtained from an array of 256 memory cells (i.e. three times 170 nA).

A typical memory array may be formed of multiple columns of 256 stacked memory cells, as shown in FIG. 8. As explained above, a tracking circuit 82 formed of 32 tracking bit cells provides a good approximation of the reference current (without accounting for the leakage current). Each tracking bit cell has a height substantially equal to two memory cells (and the width of eight memory cells). Therefore, a tracking circuit 82 formed of 32 tracking bit cells has a height equivalent to the height of 64 memory cells. Thus, there is a space equivalent to the height of 192 memory cells available above the stack 82 of tracking bit cells, as shown in FIG. 8. Embodiments of the present techniques fill this space with an array of memory cells 92 which are not used to store data but are used to provide the additional current in the tracking circuit to account for the leakage current. As shown in FIG. 8, the array 92 of memory cells comprises eight columns of 190 memory cells (referred to in the diagram as "regular bitcells"). One of the eight columns is labelled 94 in FIG. 8. The wordlines (rows) in this array 92 are tied to 0V (e.g. by coupling to ground), such that the memory cells in array 92 may be used to generate the required additional, leakage current. Two rows 98 of the available 192 rows are used as 'filler rows'. (This is a layout constraint. The regular bitcells have a different physical layout/structure compared with the tracking bitcells (in terms of the vertical metals that come down from each bit cell), so one or more filler rows may be required where unused bit lines (BL3-BL7) can be terminated, and BL0-BL1-BL2 can be shorted together.)

In embodiments, three of the bit lines (columns) in array 92 may be tied together (as illustrated by reference numeral 96 in FIG. 8), such that the leakage current outputted by the array 92 is equal to three times the leakage of the 190 memory cells in each column. Accordingly, the output of the tracking circuit which comprises a ladder of 32 tracking bit cells and an array 92 of memory cells that generate a leakage current is an approximation of the reference current that takes into account leakage:

$$I_{ref} \approx \sqrt{I_{HRS}I_{LRS}} + 3I_{leak} \quad \text{Equation 6}$$

In embodiments therefore, the tracking circuit may further comprise: a plurality of bit cells that are stacked in a ladder arrangement and which are coupled to the plurality of tracking bit cells; and wherein the plurality of bit cells together provide a leakage current offset used to generate the reference current.

In embodiments, the plurality of bit cells may comprise a plurality of column lines that are each coupled to ground.

In embodiments, two or more of the plurality of column lines may be tied together to provide a multiple of the leakage current offset.

In embodiments, the reference current generated by the tracking circuit may be equal to a sum of the multiple of the leakage current offset, and a geometric mean of a current through a CES element in a high impedance state and a current through a CES element in a low impedance state.

In embodiments, the multiple of the leakage current offset is modifiable by varying the number of column lines which are tied together.

In embodiments, the tracking circuit may be coupled to at least one sense amplifier (or other suitable sensing means) for reading one or more of the CES elements of the memory array.

Simulations suggest that a reference current generated by a tracking circuit of the type shown in FIG. 8 may be within 5% of the theoretical reference current. The simulations are based on a tracking circuit with a height equivalent to 256 memory cells (i.e. a stack of 32 tracking bit cells to approximate $\sqrt{I_{HRS}I_{LRS}}$ and an array of 190 memory cells to provide $3I_{leak}$. One column of the array of 190 memory cells was placed into a low resistance state, and another column of the array of memory cells was placed into a high resistance state. One tracking bit cell of the stack of 32 tracking bit cells was instantiated. FIG. 9a is a table showing the simulation results of the tracking circuit at a slow-slow (SS) process corner at −40° C., FIG. 9b is a table showing simulation results of the tracking circuit at a typical-typical (TT) process corner at 25° C., and FIG. 9c is a table showing simulation results of the tracking circuit at a fast-fast process corner at 125° C.

In each of the tables of FIGS. 9a to 9c, the first two columns show the nominal low resistance state resistance values and the high resistance state resistance values of the instantiated tracking bit cell. (That is, referring back to FIG. 4, first column shows the set values for CES elements 62 and 64, while the second column shows the set values for CES elements 66 and 68). The third and fourth columns show the effective resistance values for the CES elements when taking into account a leakage current through a 256 column bitslice. Specifically, the third column shows the effective resistance of the instantiated tracking bit cell when the accessed memory cell is in a low resistance state and all the leaking memory cells are in a high resistance state, while the fourth column shows the effective resistance of the instantiated tracking bit cell when the accessed memory cell is in a high resistance state and all the leaking memory cells are in a low resistance state.

The fifth column in each of the tables of FIGS. 9a to 9c shows the theoretical resistance value (i.e. the geometric mean of the effective low resistance state resistance value and the effective high resistance state resistance value in the third and fourth columns). The sixth column shows the measured effective resistance of the tracking bit cell obtained from the simulations, and the seventh column shows the difference between the measured effective resistance and the theoretical resistance value, as a percentage.

It can be seen from the tables of FIGS. 9a to 9c that the difference between the theoretical resistance value and the measured effective resistance (i.e. the '% error' or accuracy) is affected when the ratio of the low resistance state set value and the high resistance state set value increases. However, in this case, the sensing scheme may itself be more robust such that an approximation to the reference current is not necessarily required. Similarly, when the ratio of the low resistance state set value and the high resistance state set value decreases, the sensing scheme may be the least robust such that a reference current is desirable.

As mentioned earlier, embodiments of the present techniques provide methods and circuitry to generate a close approximation to a theoretical reference current, which may be used for any current sensing scheme or voltage sensing scheme. In some cases, the difference between the theoretical reference current and the generated reference current is less than 5%.

The reference current generated by the present techniques is a function of the memory cell resistances themselves, i.e. the high resistance and low resistance of the memory cells of the memory array being read. Consequently, the present techniques are immune to global variations in the resistance. In other words, the present techniques may be able to generate a close approximation to a theoretical reference current regardless of whether the low resistance state is 100 kΩ and the high resistance state is 10 MΩ or if the low resistance state is 20 kΩ and the high resistance state is 2 MΩ.

The accuracy (i.e. the % error) of the present techniques increases the ratio of the low resistance state and the high resistance state gets smaller (which is when a sensing scheme is least robust). Accordingly, the present techniques improve the overall sensing scheme robustness at lower ratios of low resistance state to high resistance state.

A further advantage of the present techniques is that the stack of tracking bit cells within a tracking circuit employs more than 50 CES elements to generate the reference current approximation, the effect of local variations is reduced due to an averaging effect. (Each tracking bit cell comprises four CES elements, and even if the tracking circuit comprises a stack of sixteen tracking bit cells, the circuit comprises more than 50 CES elements). That is, if manufacturing errors mean the actual resistance values of the CES elements varies slightly, the number of CES elements used in the tracking circuit means there is some tolerance to the variation.

Those skilled in the art will appreciate that while the foregoing has described what is considered to be the best mode and where appropriate other modes of performing present techniques, the present techniques should not be limited to the specific configurations and methods disclosed in this description of the preferred embodiment. Those skilled in the art will recognise that present techniques have a broad range of applications, and that the embodiments may take a wide range of modifications without departing from the any inventive concept as defined in the appended claims.

Accordingly, some aspects and features of the disclosed embodiments are set out in the following numbered items:
1. A memory device comprising: a memory array comprising a plurality of correlated electron switch (CES) elements;

and at least one tracking circuit to generate a reference current for reading each of the plurality of CES elements in the memory array.

2. The memory device as itemed in item 1 wherein the tracking circuit comprises at least one tracking bit cell, and wherein the tracking bit cell comprises: a reference column line, and a first CES element provided in series with the reference column line; a ground column line, and a second CES element provided in series with the ground column line; and a third CES element and a fourth CES element provided in a parallel arrangement between the reference column line and the ground column line.

3. The memory device as itemed in item 2 wherein the tracking circuit comprises a plurality of tracking bit cells that are stacked in a ladder arrangement.

4. The memory device as itemed in item 3 wherein the tracking circuit comprises 16 tracking bit cells that are stacked in a ladder arrangement.

5. The memory device as itemed in item 3 wherein the tracking circuit comprises 32 tracking bit cells that are stacked in a ladder arrangement.

6. The memory device as itemed in any one of items 2 to 5 wherein the first CES element, the second CES element, the third CES element and the fourth CES element are manufactured in a low impedance state.

7. The memory device as itemed in item 6 wherein: the third CES element and the fourth CES element of the or each tracking bit cell are both programmed into a high impedance state.

8. The memory device as itemed in item 7 wherein the third CES element and the fourth CES element of the or each tracking bit cell are programmed into a high impedance state once during an initialisation process.

9. The memory device as itemed in item 7 wherein the third CES element and the fourth CES element of the or each tracking bit cell are programmed into a high impedance state each time the tracking circuit is used to generate the reference current.

10. The memory device as itemed in any preceding item wherein the reference current generated by the tracking circuit is a geometric mean of a current through a CES element in a high impedance state and a current through a CES element in a low impedance state.

11. The memory device as itemed in any preceding item wherein the tracking circuit comprises a reference node and wherein application of a read voltage to the reference node generates the reference current.

12. The memory device as itemed in any one of items 1 to 11 further comprising a plurality of sense amplifiers coupled to the plurality of CES elements of the memory array, and wherein the reference current generated by the tracking circuit is mirrored to each of the plurality of sense amplifiers.

13. The memory device as itemed in any one of items 1 to 11 further comprising: a plurality of sense amplifiers, wherein one of the plurality of sense amplifiers is coupled to each column of the memory array; and wherein the reference current generated by the tracking circuit is mirrored to each of the plurality of sense amplifiers.

14. The memory device as itemed in any one of items 1 to 11 further comprising: a plurality of sense amplifiers, wherein one of the plurality of sense amplifiers is coupled to each column of the memory array; a plurality of tracking circuits, wherein one tracking circuit is coupled to the sense amplifier coupled to each column of the memory array; and wherein each tracking circuit generates the reference current for the sense amplifier to which the tracking circuit is coupled.

15. The memory device as itemed in item 3 wherein the tracking circuit further comprises: a plurality of bit cells that are stacked in a ladder arrangement and which are coupled to the plurality of tracking bit cells; and wherein the plurality of bit cells together provide a leakage current offset used to generate the reference current.

16. The memory device as itemed in item 15, wherein the plurality of bit cells comprise a plurality of column lines that are each coupled to ground.

17. The memory device as itemed in item 16 wherein two or more of the plurality of column lines are tied together to provide a multiple of the leakage current offset.

18. The memory device as itemed in item 17 wherein the reference current generated by the tracking circuit is equal to a sum of the multiple of the leakage current offset, and a geometric mean of a current through a CES element in a high impedance state and a current through a CES element in a low impedance state.

19. The memory device as itemed in item 18 wherein the multiple of the leakage current offset is modifiable by varying the number of column lines which are tied together.

20. The memory device as itemed in any one of items 15 to 19 wherein the tracking circuit is coupled to at least one sense amplifier for reading one or more of the CES elements of the memory array.

21. A memory device comprising: a memory array comprising a plurality of correlated electron switch (CES) elements; at least one tracking circuit to generate a reference current for reading each of the plurality of CES elements in the memory array; and a sensing circuit for reading, using the reference current, one or more of the correlated electron switch elements of the memory array.

22. A method for reading a memory device, the method comprising: applying a read voltage to a tracking circuit, the tracking circuit for generating a reference current for reading a memory array comprising a plurality of correlated electron switch (CES) elements; generating a reference current; and providing the reference current to one or more read circuits for reading the plurality of CES elements of the memory array.

23. The method of item 22 further comprising: selecting one of the plurality of CES elements to read; applying the read voltage to the selected CES element; measuring a sense current through the selected CES element; comparing the measured sense current to the generated reference current; and determining, based on the comparing, a state of the selected CES element.

24. A method for reading a memory device, the method comprising: precharging a tracking circuit by applying a read voltage to the tracking circuit, the tracking circuit for generating a reference current for reading a memory array comprising a plurality of correlated electron switch (CES) elements; selecting one of the plurality of CES elements to read; precharging a bit line of the selected CES element; discontinuing the read voltage simultaneously from the tracking circuit and the bit line of the selected CES element; monitoring discharging of the tracking circuit and the bit line of the selected CES element; and determining, based on the monitoring, a state of the selected CES element.

25. The method of item 24 wherein determining a state of the selected CES element comprises: determining if, when the tracking circuit has discharged, the bit line of the selected CES element has discharged.

26. The method of item 25 wherein if the bit line of the selected CES element has discharged, the state of the selected CES element is determined to be a low impedance state.

27. The method of item 25 wherein if the bit line of the selected CES element has not discharged when the tracking circuit has discharged, the state of the selected CES element is determined to be a high impedance state.

The invention claimed is:

1. A memory device comprising:
 a memory array comprising a plurality of correlated electron switch (CES) elements; and
 at least one tracking circuit to generate a reference current to read each of the plurality of CES elements in the memory array, and
 wherein the tracking circuit comprises a plurality of tracking bit cells stacked in a ladder arrangement to generate the reference current, each tracking bit cell formed of CES elements which are in a high resistance state and CES elements which are in a low resistance state.

2. The memory device as claimed in claim 1, wherein the tracking circuit comprises at least one tracking bit cell, and wherein the tracking bit cell comprises:
 a reference column line, and a first CES element provided in series with the reference column line;
 a ground column line, and a second CES element provided in series with the ground column line; and
 a third CES element and a fourth CES element provided in a parallel arrangement between the reference column line and the ground column line.

3. The memory device as claimed in claim 1, wherein the tracking circuit comprises 16 tracking bit cells that are stacked in a ladder arrangement or
 wherein the tracking circuit comprises 32 tracking bit cells that are stacked in a ladder arrangement.

4. The memory device as claimed in claim 2, wherein the first CES element, the second CES element, the third CES element and the fourth CES element are manufactured in a low resistance state.

5. The memory device as claimed in claim 4, wherein:
 the third CES element and the fourth CES element of the or each tracking bit cell are both programmed into a high resistance state.

6. The memory device as claimed in claim 5, wherein the third CES element and the fourth CES element of the or each tracking bit cell are programmed into a high resistance state once during an initialisation process or
 wherein the third CES element and the fourth CES element of the or each tracking bit cell are programmed into a high resistance state each time the tracking circuit is used to generate the reference current.

7. The memory device as claimed in claim 1, wherein the reference current generated by the tracking circuit is a geometric mean of a current through a CES element in a high resistance state and a current through a CES element in a low resistance state.

8. The memory device as claimed in claim 1, wherein the tracking circuit comprises a reference node and wherein application of a read voltage to the reference node generates the reference current.

9. The memory device as claimed in claim 1, further comprising a plurality of sense amplifiers coupled to the plurality of CES elements of the memory array, and wherein the reference current generated by the tracking circuit is mirrored to each of the plurality of sense amplifiers.

10. The memory device as claimed in claim 1, further comprising:
 a plurality of sense amplifiers, wherein one of the plurality of sense amplifiers is coupled to each column of the memory array; and
 wherein the reference current generated by the tracking circuit is mirrored to each of the plurality of sense amplifiers.

11. The memory device as claimed in claim 1, further comprising:
 a plurality of sense amplifiers, wherein one of the plurality of sense amplifiers is coupled to each column of the memory array;
 a plurality of tracking circuits, wherein one tracking circuit is coupled to the sense amplifier coupled to each column of the memory array; and
 wherein each tracking circuit generates the reference current for the sense amplifier to which the tracking circuit is coupled.

12. The memory device as claimed in claim 3, wherein the tracking circuit further comprises:
 a plurality of bit cells that are stacked in a ladder arrangement and which are coupled to the plurality of tracking bit cells; and
 wherein the plurality of bit cells together provide a leakage current offset used to generate the reference current.

13. The memory device as claimed in claim 12, wherein the plurality of bit cells comprise a plurality of column lines that are each coupled to ground.

14. The memory device as claimed in claim 13, wherein two or more of the plurality of column lines are tied together to provide a multiple of the leakage current offset.

15. The memory device as claimed in claim 14, wherein the reference current generated by the tracking circuit is equal to a sum of the multiple of the leakage current offset, and a geometric mean of a current through a CES element in a high resistance state and a current through a CES element in a low resistance state.

16. The memory device as claimed in claim 15, wherein the multiple of the leakage current offset is modifiable by varying the number of column lines which are tied together.

17. A memory device comprising:
 a memory array comprising a plurality of correlated electron switch (CES) elements;
 at least one tracking circuit to generate a reference current for reading each of the plurality of CES elements in the memory array, wherein the tracking circuit comprises a plurality of tracking bit cells stacked in a ladder arrangement to generate the reference current, each tracking bit cell formed of CES elements which are in a high resistance state and CES elements which are in a low resistance state; and
 a sensing circuit for reading, using the reference current, one or more of the correlated electron switch elements of the memory array.

18. A method for reading a memory device, the method comprising:
 applying a read voltage to a tracking circuit, the tracking circuit for generating a reference current for reading a memory array comprising a plurality of correlated electron switch (CES) elements and wherein the tracking circuit comprises a plurality of tracking bit cells stacked in a ladder arrangement to generate the reference current, each bit cell formed of CES elements which are in a high resistance state and CES elements which are in a low resistance state;

generating a reference current; and providing the reference current to one or more read circuits for reading the plurality of CES elements of the memory array.

\* \* \* \* \*